United States Patent
Gaynor

(10) Patent No.: US 9,647,631 B2
(45) Date of Patent: May 9, 2017

(54) TUNABLE IMPEDANCE MATCHING NETWORK

(71) Applicant: PEREGRNE SEMICONDUCTOR CORPORATION, San Diego, CA (US)

(72) Inventor: Michael P. Gaynor, Crystal Lake, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 269 days.

(21) Appl. No.: 13/967,866

(22) Filed: Aug. 15, 2013

(65) Prior Publication Data

US 2015/0048898 A1 Feb. 19, 2015

(51) Int. Cl.
| | |
|---|---|
| H03H 7/38 | (2006.01) |
| H03H 3/00 | (2006.01) |
| H03H 7/40 | (2006.01) |
| H03H 11/30 | (2006.01) |

(52) U.S. Cl.
CPC ............. *H03H 7/40* (2013.01); *H03H 11/30* (2013.01); *Y10T 29/49018* (2015.01)

(58) Field of Classification Search
CPC ............. H03H 7/38; H03H 3/00; H03H 7/40
USPC ........................................................ 333/124
See application file for complete search history.

(56) References Cited

U.S. PATENT DOCUMENTS

| | | | |
|---|---|---|---|
| 5,917,387 A * | 6/1999 | Rice et al. ..................... 333/174 |
| 6,674,321 B1 * | 1/2004 | York .............................. 327/586 |
| 6,686,817 B2 * | 2/2004 | Zhu ..................... H01P 1/20336 |
| | | | 257/595 |
| 6,765,540 B2 | 7/2004 | Toncich | |
| 7,009,455 B2 | 3/2006 | Toncich et al. | |
| 7,385,465 B2 * | 6/2008 | Chen ........................ H03H 7/46 |
| | | | 333/175 |
| 7,907,033 B2 | 3/2011 | Morris, III et al. | |
| 8,749,307 B2 * | 6/2014 | Zhu ....................... H03F 1/0233 |
| | | | 330/129 |
| 2004/0246074 A1 * | 12/2004 | Humphrey .............. H03J 5/244 |
| | | | 333/174 |
| 2011/0070848 A1 * | 3/2011 | Ramachandra Reddy 455/127.2 |
| 2012/0302188 A1 * | 11/2012 | Sahota et al. ............... 455/150.1 |
| 2013/0222075 A1 * | 8/2013 | Reedy ................. H03M 1/1061 |
| | | | 333/32 |

OTHER PUBLICATIONS

Sjoblom et al., An Adaptive Impedance Tuning CMOS Circuit for ISM 2.4-GHz Band, Jun. 2005, IEEE Transactions on Circuits and Systems, p. 1115-1123.*

* cited by examiner

*Primary Examiner* — Stephen E Jones
*Assistant Examiner* — Scott S Outten
(74) *Attorney, Agent, or Firm* — Jaquez Land Greenhaus LLP; Martin J. Jaquez, Esq.; Alessandro Steinfl, Esq.

(57) ABSTRACT

A tunable impedance matching network comprising shunt (e.g. parallel) tunable capacitors and other fixed reactive elements is presented. The tunable impedance matching network can be used as one component of an SPTM (scalable periphery tunable matching) amplifier.

30 Claims, 7 Drawing Sheets

|  | 420 | 450 | 490 |
| --- | --- | --- | --- |
| High power | 2.2pF | 2.7pF | 0.5pF |
| 1st power backoff | 1.8pF | 2.5pF | 1pF |
| 2nd power backoff | 1pF | 5.2pF | 3.4pF |
| 3rd power backoff | 1pF | 2.9pF | 2.2pF |
| 4th power backoff | 0.7pF | 2.5pF | 1pF |
| 5th power backoff | 0.5pF | 1.8pF | 1pF |
| 6th power backoff | 0.5pF | 0.8pF | 0.5pF |

FIG. 5

TUNABLE IMPEDANCE MATCHING NETWORK

CROSS REFERENCE TO RELATED APPLICATIONS

The present application may be related U.S. Pat. No. 7,907,033 B2, "Tunable Impedance Matching Networks and Tunable Diplexer Matching Systems", issued on Mar. 15, 2011, incorporated by reference herein in its entirety.

BACKGROUND

1. Field

The present application relates to impedance matching. More particularly, the present application relates to a tunable impedance matching network.

2. Description of Related Art

In order to enable optimal power transfer between circuits having different impedance values, an impedance matching network is generally provided. If one or both of the impedance values being matched is subject to change, a tunable impedance matching network which can adjust for changing conditions is adopted.

Reference can be made, for example, to a cellular phone, which comprises RF (radio frequency) circuits and antennas. Impedance of an antenna of the cell phone can change as the environment surrounding the antenna changes, such as proximity of the antenna to metal, head, hand, and so forth. A tunable impedance matching network is tied to the antenna in order to compensate for such changes.

A tunable impedance matching network can also be used to compensate for tolerance in a product if the product requires specific design tolerances. The product may be automatically tuned in the factory during a test phase, producing a tuned setting of the tunable impedance matching network, so that the tunable impedance matching network is fixed at the tuned setting upon completion of the test phase.

A tunable impedance matching network may also be used to change filter performance or bandwidth in a product. For example, a variable impedance port of a tunable impedance matching network can be connected as a shunt (e.g. parallel) impedance in a filter. Adjusting impedance of the variable impedance port of the tunable impedance matching network can correspond to adjusting the shunt impedance of the filter, thereby changing filter performance.

SUMMARY

According to a first aspect of the present disclosure an impedance matching network having a first impedance matching terminal and a second impedance matching terminal is presented, the impedance matching network comprising: a first parallel reactive network connected to the first impedance matching terminal of the impedance matching network, the first parallel reactive network comprising a plurality of parallel branches connected in parallel, each parallel branch comprising one or more reactive elements connected in series, wherein one parallel branch from among the plurality of parallel branches comprises two series-connected elements; a series reactive network having a first terminal and a second terminal, the series reactive network comprising one or more reactive elements connected in series, the first terminal of the series reactive network being connected to a node joining the two series-connected elements of the one parallel branch of the first parallel reactive network; and a second parallel reactive network connected to the second impedance matching terminal of the impedance matching network, the second parallel reactive network comprising a plurality of parallel branches connected in parallel, each parallel branch comprising one or more reactive elements connected in series, the second parallel reactive network being connected to the second terminal of the series reactive network.

According to a second aspect of the present disclosure a method for reducing insertion loss in a tunable impedance matching network is provided, the method comprising: forming a plurality of parallel tunable reactive networks each comprising a plurality of parallel branches connected in parallel; series-connecting the plurality of parallel tunable reactive networks using fixed inductors between the plurality of parallel tunable reactive networks, and based on the series-connecting, obtaining a tunable impedance matching network comprising a first impedance match terminal and a second impedance match terminal in correspondence of a terminal of a first parallel tunable reactive network and a second terminal of a second parallel tunable reactive network respectively, wherein the each of the plurality of parallel branches comprise one or more series-connected reactive components comprising fixed capacitors, fixed inductors and tunable capacitors, and wherein the each of the plurality of parallel branches is devoid of tunable inductors.

According to a third aspect of the present disclosure a method for reducing a size of a tunable impedance matching network is provided, the method comprising: forming a tunable impedance matching network comprising a plurality of reactive elements, wherein tuning of the tunable impedance matching network is provided via shunting capacitors only.

BRIEF DESCRIPTION OF DRAWINGS

FIG. 5 shows a table corresponding to exemplary values of tunable capacitors of the tunable impedance matching network shown in FIG. 2.

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

As used herein, the term "reactive network" refers to a network comprising one or more reactive elements, such as capacitors and/or inductors.

As used herein, the term "parallel reactive network" refers to a reactive network comprising two or more branches that are connected in parallel, each branch comprising one or more reactive elements.

As used herein, the term "series reactive network" refers to a reactive network comprising one or more reactive elements that are connected in series.

As used herein, the term "tunable capacitor" refers to a capacitor whose capacitance value is adjustable during circuit operation.

As used herein, the term "digitally tunable capacitor" (DTC) refers to a tunable capacitor whose capacitance value can be adjusted by a digital signal during circuit operation. Digitally tunable capacitors are described, for example, in U.S. Patent Publication No. 2011/0002080 A1, "Method and Apparatus for Use in Digitally Tuning a Capacitor in an Integrated Circuit Device", published on Jan. 6, 2011, incorporated by reference herein in its entirety.

As used herein, the term "high power range" refers to a region comprising the uppermost 30% of a power range that an SP amplifier is capable of producing at an output of a scalable periphery tunable matching (SPTM) circuit.

As used herein, the term "mid-power range" refers to a region comprising the middle 40% of a power range that an SP amplifier is capable of producing at an output of an SPTM circuit.

As used herein, the term "low power range" refers to a region comprising the lowermost 30% of a power range that an SP amplifier is capable of producing at an output of an SPTM amplifier.

As used herein, the terms "DG09" and "HP2" refer to usage profiles for the statistics of the phone output power in normal usage. The person skilled in the art will know that DG09 refers to a normal voice usage profile, whereas HP2 refers to a high data rate usage profile. These terms can be used to compare power amplifier performance by integrating the power amplifier dissipated power at each output power setting over the likelihood of the amplifier operating at that power output setting. The "HP2" is a usage profile for high power data mode.

Figure 1:
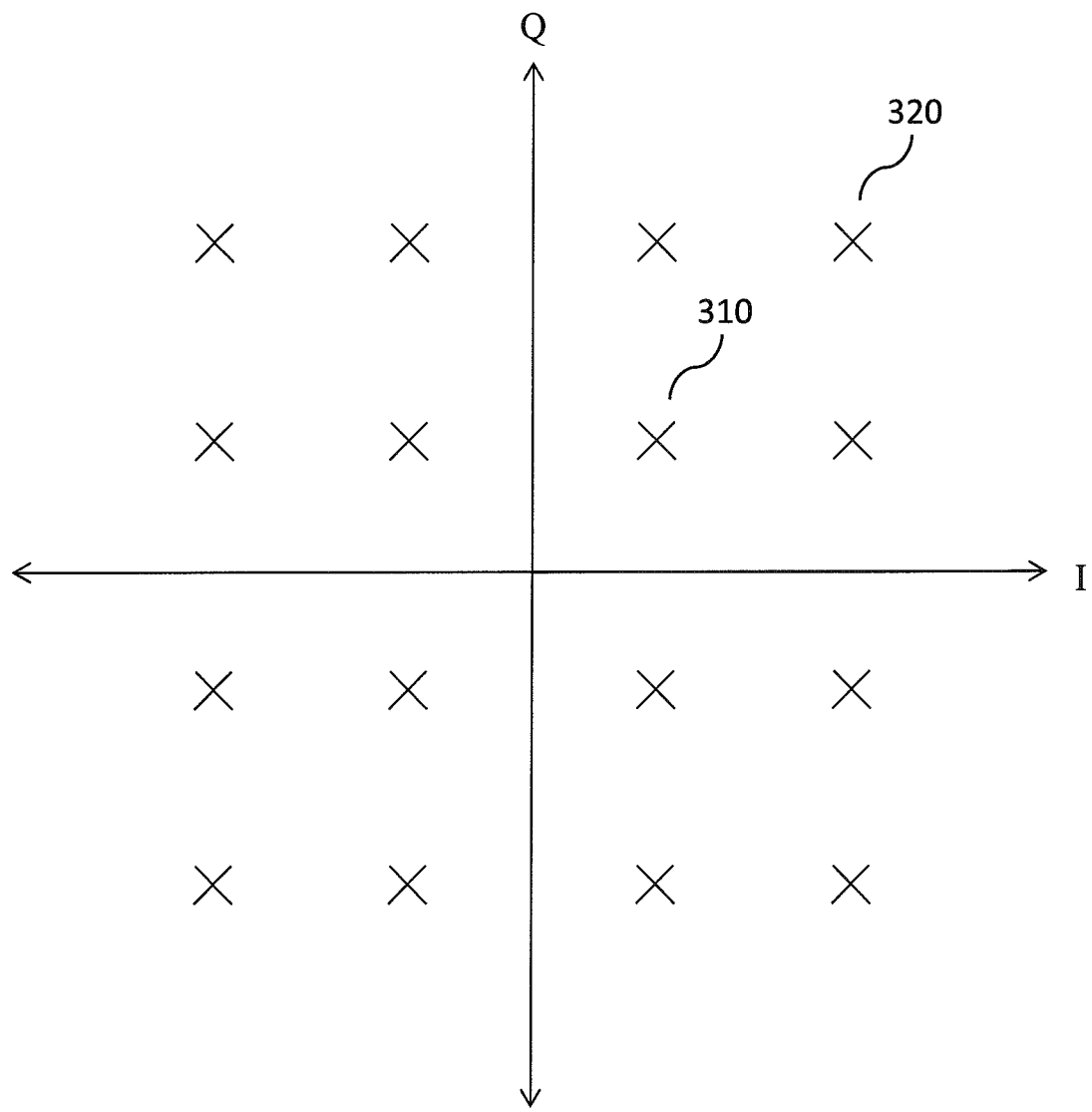
FIG. 1 shows a constellation diagram of two different signals.

Many RF front ends currently present in cellular phones and other wireless devices comprise discrete devices. However, a higher degree of integration in RF front ends can be desirable, because market forces tend to push for more data throughput, which can result in more complex waveforms being transmitted. For example, a constant envelope frequency modulated (FM) signal may be relatively simple compared to a waveform corresponding to 16 quadrature amplitude modulation (QAM). According to an example embodiment of present disclosure, FIG. 1 shows an exemplary signal constellation corresponding to 16 QAM. In the exemplary FIG. 1, each 'x' represents one of 16 possible signals to be transmitted, where phase and amplitude of an RF waveform to be transmitted can correspond to angle between a vector to an x representing the given signal and a horizontal axis I and a length of such vector, respectively. Use of signal constellations to represent a modulation scheme used in producing an RF waveform is known in the art.

Transmission of more complex waveforms can require amplifiers with more linearity, because distortion of amplitude or phase caused by nonlinearity can be less tolerated in terms of correct signal transmission. With reference to the example embodiment of FIG. 1, a first signal (310) and a second signal (320) both have identical phase, as expressed by direction of a vector from an origin to each of the two signals (310, 320), but different amplitudes, as expressed by magnitude of a vector from the origin to each of the two signals (310, 320). Nonlinearity of an amplifier can result in amplitude distortion, causing the first signal (310) to be erroneously transmitted in a case where the second signal (320) was intended to be transmitted. As signal points in a signal constellation corresponding to a modulation scheme of an RF waveform become more densely packed, smaller amounts of amplitude distortion can result in erroneous signal transmission. In some cases, amplitude distortion can also result in phase distortion.

However, an amplifier is typically more efficient in power use when operating nonlinearly as opposed to operating linearly. For example, as is known by one skilled in the art, a class A amplifier is typically considered to be more linear than a class B amplifier, but a class A amplifier is also typically considered less efficient than a class B amplifier. Additionally, it could be desirable for an amplifier to be adapted/configured to operate in different modes as well as on different frequency bands. A "mode" as used herein may refer to a given wireless standard, such as Global System for Mobile Communications (GSM) or wideband code division multiple access (WCDMA), and attendant modulation and coding scheme(s). Furthermore, there could be a consistent market push towards smaller sizes of cellular phones and other wireless devices. Because of such demands for more data throughput, more linearity, higher efficiency, multimode and/or multiband operation, a more integrated and configurable (e.g. comprising adjustable components that are tunable or can change their value when operating conditions change such as but not limited to mode or frequency band) RF front end could be useful.

A more integrated RF front end where one or more components are adjustable can be reduced in size and complexity compared to a discrete RF front end with multiple elements that can be switched between in order to accommodate different modes and different bands. One component that can enable such integration is an amplifier that can be dynamically adjusted during operation of a cellular phone or wireless device that comprises the adjustable amplifier. An RF front end comprising such an adjustable amplifier could not need to switch between multiple fixed amplifiers (e.g. as in many RF front ends currently available), but could rather use a smaller number of (or even one of) the adjustable amplifiers to achieve desired performance characteristics (e.g. linearity, data throughput, multimode multiband operation, and so on). A scalable periphery tunable matching amplifier (SPTM) amplifier can serve as an adjustable amplifier. An SPTM amplifier can be adjusted during operation for different output power levels and other characteristics (e.g. different output impedances, different frequencies of operation, and so forth). Additionally, an SPTM can be adjusted to compensate for manufacturing/production tolerances of related components, such as to provide uniform performance across all production samples. An SPTM amplifier can comprise a scalable periphery amplifier whose output is connected to a tunable impedance matching network.

Figure 2:
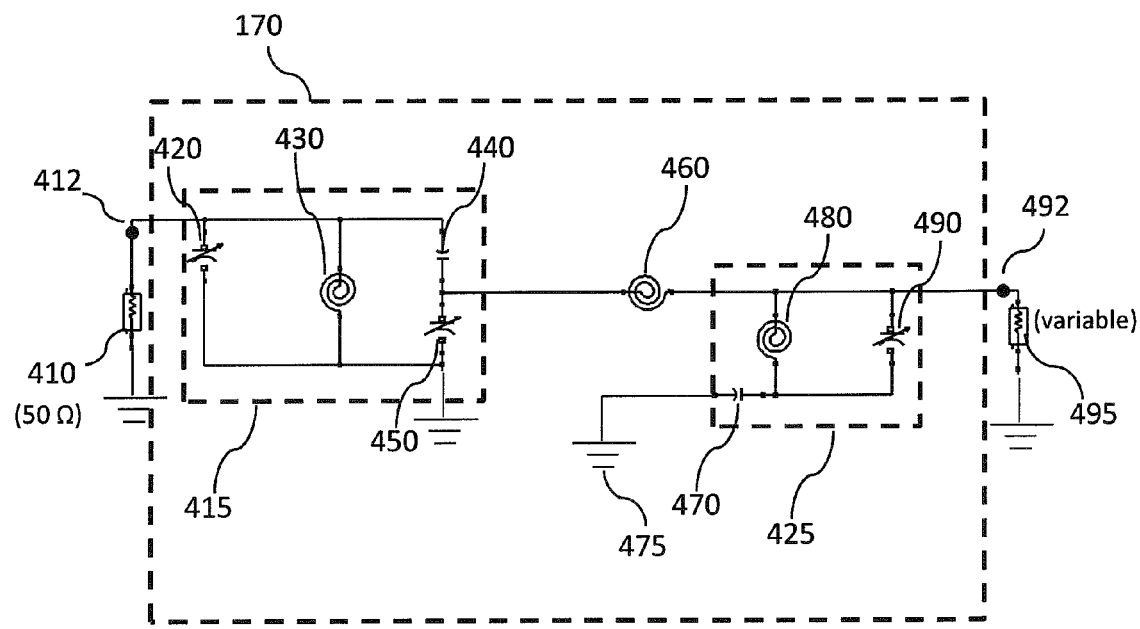
FIG. 2 shows a tunable impedance matching network according to an embodiment of the present disclosure.

According to an example embodiment of the present disclosure, FIG. 2 shows a circuit comprising a tunable impedance matching network (170), matching a variable impedance (495) connected to an impedance matching terminal (492) of the tunable matching network (170) to a fixed impedance (410) connected at another impedance matching terminal (412) of the tunable matching network (170) or vice versa. The example embodiment of the tunable impedance matching network (170) of FIG. 2 comprises a first parallel reactive network (415), a second parallel reactive network (425) and a series inductor (460) connecting the first parallel reactive network (415) with the second parallel network (425). By way of example and not of limitation, the fixed impedance (410) can be a 50Ω impedance, which is a common standard impedance for RF circuits.

In accordance with the present disclosure, in the example embodiment of FIG. 2, the first parallel reactive network (415) comprises a parallel arrangement of a tunable capacitor (e.g., a DTC) (420), an inductor (430), and a branch comprised of a fixed capacitor (440) in series with a tunable capacitor (e.g., a DTC) (450).

In the example embodiment of FIG. 2, a first terminal of the series inductor (460) is connected to a node joining the fixed capacitor (440) and the tunable capacitor (450) of the first parallel reactive network (415). A second terminal of the series inductor (460) is connected to a first terminal of the second parallel reactive network (425). A second terminal of the second parallel reactive network (425) is connected to ground (475). The person skilled in the art will know that in the example embodiment of the circuit shown in FIG. 2, connections to ground can be to a true system ground, AC ground or even a reference potential to the circuit.

In accordance with the present disclosure, the second parallel reactive network (425) of the example embodiment of FIG. 2, comprises an inductor (480) in parallel with a tunable capacitor (e.g., a DTC) (490). Both the inductor (480) and the tunable capacitor (490) of the second parallel reactive network (425) are connected in series with a capacitor (470). The capacitor (470) is further connected to ground (475), thus forming the above mentioned connection between the second terminal of the second parallel reactive network (425) and ground.

The tunable impedance matching network (170) shown in the example embodiment of FIG. 2, can be adjusted (e.g. in response to changes in the variable impedance (495)) by tuning one or more of the tunable capacitors (420, 450, 490). However, the tunable capacitors (420, 450, 490), e.g. DTCs, may introduce more insertion loss (due, for example, to the ON resistances of the switches in a DTC) than equivalent fixed capacitors. The example embodiment of FIG. 2 reduces such problem by placing the tunable capacitors in parallel branches, such as those of networks (415) and (425), since a tunable capacitor in parallel can introduce less loss than a tunable capacitor in series. In the several example embodiments of the present disclosure, DTCs (420, 450, 490) are connected in shunt as opposed to in series because of the reasons as following. Firstly, by placing tunable capacitors in shunt, the capacitors at low impedances in the impedance matching network can be made smaller since they will be subject to lower voltage swings, thus reducing the loss. Secondly, as known in the art, an imbalance in the DTC can occur with one side being a higher Q connection than the other, which can be used as an advantage when connected in shunt. However, the example embodiment of the tunable impedance matching network (170) of FIG. 2 is devoid of tunable inductors.

By using a minimal number (e.g. three) of tuned capacitors and not using tuned capacitors in series (only inductor (460) is in a series branch of the tunable impedance matching network), insertion loss between the variable impedance (495) and the fixed impedance (410) can be reduced and the overall quality factor of the circuit can be improved. In the example embodiment of FIG. 2, the fixed capacitor (470) can be replaced with a tuned capacitor for a better tuning range of the tunable matching network (170), although this may increase the insertion loss of the overall circuit, as noted above.

A barium-strontium-titanate (BST) tunable capacitor or a microelectromechanical system (MEMS) tunable capacitor can also be used in place of a DTC in the example embodiment of the tunable impedance matching network of FIG. 2. A BST capacitor can use a comparatively large voltage (e.g. 50 V) to tune; tuning occurs through change of the dielectric properties of the BST capacitor. On the other hand, a MEMS capacitor may use a comparatively large voltage (e.g. 50V) to tune as well, where tuning occurs through change of the shape of the MEMS capacitor. With BST, MEMS and DTC capacitors, the capacitance value can be tuned by a factor of 3 to 4 between its lowest value and highest value. Simulation results indicate that the tunable impedance matching network (170) shown in FIG. 2 can achieve low insertion loss (less than 1.6 dB for a low power case, which generally occurs infrequently, and less than 0.7 dB in most other cases) at a design frequency of 1.95 GHz across a bandwidth of 100 MHz (see FIG. 5 and associated description for exemplary component values of the impedance matching network (170) of FIG. 2).

According to an exemplary embodiment of the present disclosure, the table of FIG. 5 shows exemplary values of the various tunable capacitors (420, 450, 490) used to form the impedance matching network (170) of FIG. 2, for various cases of an output amplifier power, as set, for example, by a size of a scalable periphery amplifier. For example, the "High Power" setting may correspond to all 64 unit cells of the scalable periphery amplifier being activated (e.g. ON), and the "$1^{st}$ power backoff" may correspond to only 32 unit cell ON, "$2^{nd}$ power backoff" to 16 unit cells ON, etc. . . . down to the "$6^{th}$ power back off" in correspondence of a single unit cell of the scalable periphery amplifier being activated. Such values, as represented in the table of FIG. 5, can allow the formed impedance matching network (170) of FIG. 2 to efficiently transfer different power levels to an output load whilst output impedance of the amplifier (e.g. scalable periphery) greatly varies (e.g. due to periphery setting of the amplifier, as indicated in other sections of the present application). The exemplary values of the tunable capacitors (420, 450, 490) of the table in FIG. 5 were set assuming fixed inductor (430) value of 5 nH, fixed capacitor (440) value of 4.3 pF, fixed inductor (460) value of 1.8 nH, fixed inductor (480) value of 2 nH, and fixed capacitor (470) value of 15 pF.

As also noted above, a tunable impedance matching network can be designed in such a way that it can match a high impedance at a fixed terminal with a low impedance at a variable terminal or vice versa without any significant loss within the network. The tunable impedance matching network of FIG. 2 is designed in such a way that it can match an impedance value of, for example, 2-50Ω at the fixed terminal with an impedance value of, for example, 2-50Ω at the variable terminal and thus can match a high/low impedance at the fixed terminal with a low/high impedance at the variable terminal without any significant loss in the network.

As later noted in greater detail with reference to an example embodiment of FIG. 3, the values of the variable impedance (495) at a port of the tunable impedance matching network (170) can be viewed as output impedances of a scalable periphery (SP) amplifier. In times, when the SP amplifier operates at a high power range (e.g., all or many of the unit cells of the SP amplifier operating), the output impedance of the amplifier, as represented by the variable impedance (495), can have a low value and is to be matched to a fixed impedance (410) value of 40Ω or 45Ω. On the other hand, assuming that the SP amplifier operates in a mid-power range (e.g., half of the cells of the SP amplifier operating), the output impedance of the amplifier can be represented by a middle value of the variable impedance (495), which is to be matched to a fixed impedance (410) of 30Ω to 35Ω. For the low power range (e.g., only one unit cell of the SP amplifier operating), the output impedance of the amplifier can be represented by a high value of the variable impedance (495) which can be matched to a fixed impedance (410) of 75Ω to 90Ω. The impedance values for low power level and the medium power level can be chosen in a manner that such impedances are centered in the middle of the Smith chart so that a balance between power levels can be achieved. Once these conditions are satisfied, an optimizer can be used to determine component values that can minimize insertion loss for high power cases at the expense of increased insertion loss at lower power cases (which are anticipated to occur less frequently than high power cases) of the SP amplifier.

In case the SP amplifier operates at low power level or medium power level, the power level that is used most frequently could be tuned to the 50Ω point and the other two ranges could be adjusted to be balanced as described above. However, the highest performance for the high power mode of operation is generally considered.

As used herein, the term "component value" can refer to the values of all the components of the impedance matching network (170). In several example embodiments of the present disclosure, values for the inductors and the series capacitor can be selected based on the application/desired impedance range, and can be fixed accordingly.

Figure 3:
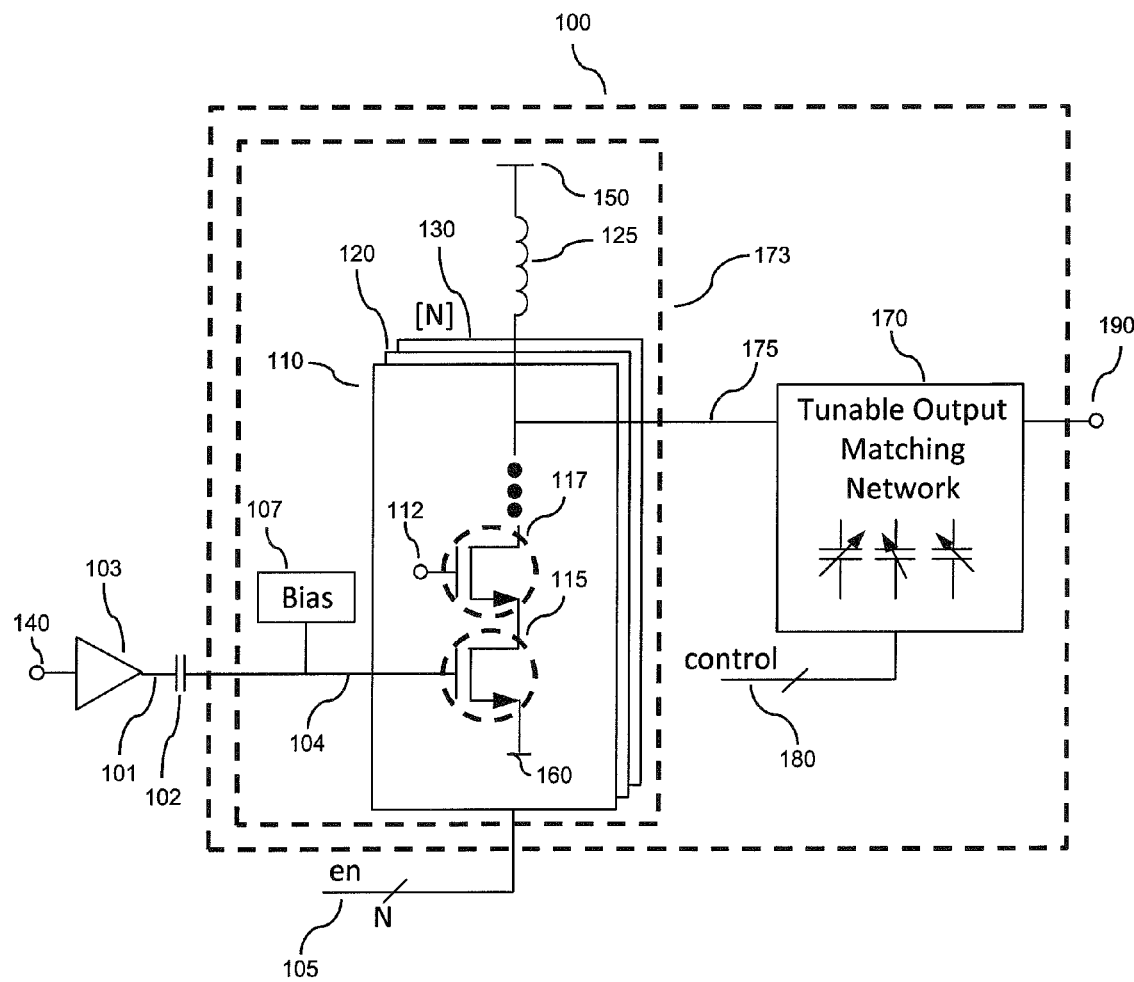
FIG. 3 shows a block diagram of an exemplary scalable periphery tunable matching (SPTM) amplifying arrangement.

In accordance with the present disclosure, FIG. 3 shows an example embodiment of a scalable periphery tunable matching SPTM amplifying arrangement (100) that comprises an SP (scalable periphery) amplifier (173) with an SP output terminal (175) that is connected to a TM (tunable matching) network (170). The example embodiment of the tunable impedance matching network (170) of FIG. 3 can correspond to the tunable impedance matching network (170) shown in FIG. 2, where a variable output impedance (175) of a scalable periphery amplifier (173) corresponds to the variable impedance (495) shown in FIG. 2 and an output impedance (190) of the tunable impedance matching network (170) corresponds to the fixed impedance (410) shown in FIG. 2.

The example embodiment of the SPTM amplifying arrangement (100) of FIG. 3 accepts an input from a driver stage (103). An RF signal applied at an input terminal (140) can be amplified by the driver stage (103) to produce a driver amplified signal at a driver output terminal (101). The driver amplified signal at the driver output terminal (101) can be passed through a bypass capacitor (102) to produce a DC blocked driver amplified signal at an SP input terminal (104) corresponding to a gate of a first FET (115), where the first FET (115) has a source connected to ground (160). A bias network (107) can be connected to the SP input terminal (104) to set a DC bias point for the SPTM amplifying arrangement (100). A bias voltage can be applied to a gate (112) of a second FET (117) or other FETs used in constructing the SP amplifier (173).

The SP amplifier (173) can amplify the DC blocked driver amplified signal at the SP input terminal (104) to produce an SP amplified signal at the SP output terminal (175). DC current can be supplied to the SP amplifier (173) from a voltage source (150) through an inductor (125), commonly referred to as an RF choke, that blocks flow of RF power. In an alternative embodiment, each unit cell (110, 120, 130) can be supplied by a separate voltage source connected via a separate inductor (RF choke).

The SP amplified signal can be applied to the TM network (170), whose impedance can be adjusted by one or more control signals (180). The one or more control signals (180) may be provided by control circuitry of a system comprising the SPTM amplifying arrangement (100), or the SPTM amplifying arrangement (100) itself may comprise control circuitry that is configured to provide the one or more control signals (180). Alternatively, the control signal (180) can originate from a microprocessor with knowledge of the approximate power level of a cell phone in which the SP amplifying arrangement can be used. However, in some applications the control signal (180) can be a digital "word" that corresponds to the power level of the cell phone in such a way that the SPTM can decipher that particular "word" from the control signal and can develop two different control signals for the SP and TM sections based on a desired output power level. Moreover, in some applications, the microprocessor can generate these control signals directly and apply them to the SPTM. In such cases, the microprocessor can determine the power level based on the request from the base station to increase or decrease the power accordingly.

A resulting SPTM amplified output signal can be sent out through an SPTM output terminal (190). The SPTM output terminal (190) can be connected to a load such as, but not limited to, an antenna of a cellular phone, downstream splitters, cables, or feed network(s) used in delivering cable television service to a consumer, a next amplifier in an RF chain at a cellular base station, or a beam forming networking in a phased array radar system.

The SP amplifier (173) comprises one or more unit cells (110, 120, 130) connected in parallel. Each unit cell (110, 120, 130) can be selectively activated or deactivated by a corresponding enable signal (105) applied to the unit cell (110, 120, 130, etc.). Each unit cell (110, 120, 130) comprises one or more transistors (115, 117) that are configured to operate as an amplifier. By way of example, and not of limitation, each unit cell can comprise a stack of two or more FETs (115, 117). The SP input terminal (104) normally corresponds to a gate of a first FET (115) in the stack, while an output signal is taken from a drain of a last (e.g. second, third, etc.) FET in the stack, such drain being connected to the SP output terminal (175). A person skilled in the art will be aware that multiple circuit elements operating in parallel will present a lower impedance than a smaller number of the same elements operating in parallel. Also, as discussed in U.S. patent application Ser. No. 13/797,779, filed on Mar. 12, 2013, improved performance can be achieved if the output impedance of the scalable periphery amplifier is increased as more unit cells are turned OFF, so as to maintain a constant impedance seen at the output of each individual unit cell. Increasing the variable impedance (495) of FIG. 2 (e.g. output impedance of the SP amplifier) as unit cells are deactivated, as well as decreasing the variable impedance (495) (e.g. output impedance of the SP amplifier) as unit cells are activated, can be performed by the tunable impedance matching network (170). Moreover, in some embodiments, the tunable capacitors (for example, see elements 420, 450, 490 in FIG. 2) and the inductors (for example, see elements 430 460 and 480 in FIG. 2) of the tunable matching network (170) can be monolithically integrated with the one or more unit amplifier (110, 120, 130) of the SP amplifier (173) using, for example, silicon on insulator (SOI) or silicon on sapphire technologies (SOS).

In FIG. 3, each enable signal (105) may be provided by control circuitry of a system comprising the SPTM amplifying arrangement (100), or the SPTM amplifying arrangement (100) itself may comprise control circuitry that is configured to provide each enable signal (105). A value of each enable signal (105) can be determined according to a desired bias current through the SPTM amplifying arrangement (100). Deactivating unit cells can result in a decreased total bias current through the SP amplifier (173), while activating unit cells can result in an increased total bias current through the SP amplifier (173). Selectively activating or deactivating unit cells to adjust bias current through the SP amplifier (173) may be referred to as adjusting a periphery, or a periphery size, of the SP amplifier (173).

Accompanying the selective activation or deactivation of unit cells for more or less power, respectively, impedance adjustment by way of the tunable impedance matching network (170) can further enhance performance of the SPTM amplifier. For example, by presenting a lower impedance (e.g. by proper adjustment of the tunable impedance matching network (170)) at an output of the scalable periphery amplifier (173) when more unit cells are activated, each individual unit cell that is active can be presented with a constant impedance. Also, as discussed in U.S. patent application Ser. No. 13/797,779, filed on Mar. 12, 2013, improved performance can be achieved if the output impedance of the scalable periphery amplifier is increased as more unit cells are turned OFF, so as to maintain a constant impedance seen at the output of each individual unit cell. Additionally, the transconductance of the SP amplifier is generally constant but the gain of the amplifier changes within a small range depending on the change of DC current through the amplifier as the number of ON SP unit cell changes. In the example embodiments of the present disclosure, the unit cells of the SP amplifier (173) can be assumed to be identical. SP amplifier with non-identical unit cells can also be used, but in that case the change in the output power will depend on the particular unit cells activated or deactivated at that particular cycle.

The one or more active devices of each unit cell in the scalable periphery amplifier (173) can be configured to operate as any class of amplifier (e.g. class A, class B, class C, class AB, class D, class E, or class F). Output current of the scalable periphery amplifier (173) can be calculated as $I_D = g_m V_{gs}$, where:

$I_D$=magnitude of output current of the scalable periphery amplifier (173), $g_m$=transconductance of the scalable periphery amplifier (173), and $V_{gs}$=magnitude of input gate to source voltage.

Based on the magnitude of the output current, which is a function of the input voltage signal and the transconductance of the scalable periphery amplifier (173), the control circuitry can selectively activate or deactivate unit cells by turning ON or shutting down the biases of those particular unit cells as needed to provide an appropriate output current. Therefore, in order to determine how many unit cells to be activated or deactivated, magnitude of an input signal to the scalable periphery amplifier (173) can be used as a reference. Moreover, the magnitude of the SP amplifier input signal which can be used to determine the number of unit cells to be activated or deactivated, can be controlled by the desired output power of the SP amplifier. Turned OFF unit cells of the SP amplifier can be viewed as capacitors at the input and/or at the output of the scalable periphery amplifier (173), and thus can be compensated for by setting of the input/output matches.

According to further embodiments of the present disclosure and with continued reference to FIG. 3, the tunable impedance matching network (170) may comprise even and/or odd harmonic termination, such as to enhance certain harmonics (e.g. odd harmonics) and/or attenuate certain harmonics of an output signal of the amplifier (173), for improved linearity and efficiency of the arrangement depicted by FIG. 3. Such harmonic shorts and/or harmonic opens may be variable/configurable harmonic terminations, configured, for example, to adapt output stage of the amplifier to different modes and frequency bands via the variable components of the tunable impedance matching network (170). Such harmonic termination may be formed by the second parallel reactive network (425) (e.g. a resonant structure) of the tunable impedance matching network (170) via appropriate selection of the corresponding reactive components (470, 480, 490). More information on variable harmonic terminations can be found in, for example, U.S. patent application Ser. No. 13/797,686, entitled "Variable Impedance Match and Variable Harmonic Terminations for Different Modes and Frequency Bands", filed on Mar. 12, 2013, which is incorporated herein by reference in its entirety.

By way of example, and not of limitation, the scalable periphery amplifier (173) of FIG. 3 may comprise 64 unit cells operating in parallel in such a way that the output impedance of the scalable periphery amplifier (173) decreases as the number of unit cells that are turned ON increases. According to the example embodiment of FIG. 3, 64-32 unit cells of the SP amplifier can operate during a high power operation, 8-16 unit cells of the SP amplifier can operate during a medium power operation, and 1-4 unit cells of SP amplifier can operate during a low power operation of the SP amplifier (173). In this particular example, the SP amplifier is assumed to be designed such as the active cells numbers being 64, 32, 16, 8, 4, 2, or 1 and nothing in-between (binary configuration). This can make the design of the SP amplifier as well as the end device construction and testing easier, as the end product needs to modify the software on each product to determine the levels where the switching occurs. The amount of time needed by the device for testing and programming purposes can be proportional to the number of settings. Therefore, in order to decrease the overall time efficiency of the device it can be desirable to reduce this programming time to get more throughput.

In an exemplary high power case where all 64 unit cells are operating, the output impedance of the scalable periphery amplifier (173) can be significantly less than 50Ω (a common standard impedance for RF circuits). In such an exemplary high power case, the tunable impedance matching network (170) can match a low output impedance of the scalable periphery amplifier to a higher impedance of 50Ω. However, in an exemplary low power case where, for example, only 2 unit cells are operating, the tunable impedance matching network (170) that is shown in FIG. 2 can match an output impedance of the scalable periphery amplifier (173) that is higher than 50Ω to a lower impedance of 50Ω. A person skilled in the art will appreciate the versatility of the tunable impedance matching network (170) in regards to its capability of matching from low impedance at the output of the scalable periphery amplifier (173) to high impedance (50Ω) as well as from high impedance at the output of the scalable periphery amplifier (173) to lower impedance (50Ω).

In accordance with the present disclosure, the design of the example tunable impedance matching network (170) capable of matching impedances for cases ranging from 64 unit cells operating to a lower extreme of 2 unit cells operating is not trivial. This is desirable when considering a wide range of the Smith chart which must be covered by the tunable impedance matching network without significant insertion loss. For example, the SPTM arrangement of FIG. 3 can be used in cellular phone applications with linear modulation or digital modulation where linearity over a range of power or frequency is expected (e.g. WCDMA or wireless LAN 802.11a).

Figure 4:
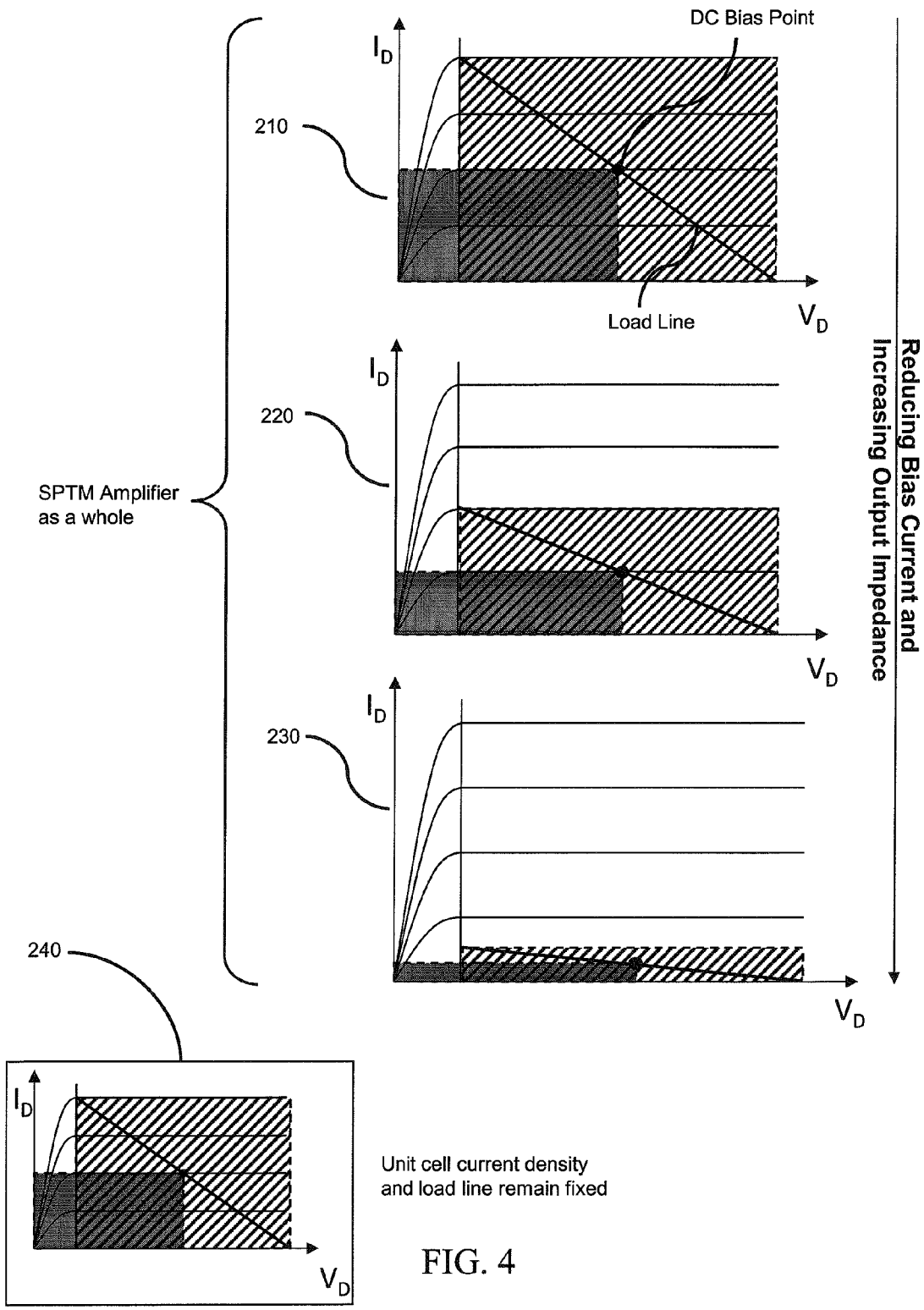
FIG. 4 shows graphs with total current through the SP amplifier of FIG. 3 represented on a vertical axis and voltage at the output terminal of FIG. 3 represented on a horizontal axis.

According to an example embodiment of the present disclosure, FIG. 4 shows graphs (210, 220, 230) with total current through the SP amplifier (173) represented on a vertical axis, and voltage at the SPTM output terminal (190) represented on a horizontal axis. In the graphs (210, 220, 230) of FIG. 4, a diagonal load line can have a slope that is equal to a negative reciprocal of resistance presented by the TM network (170) at the SP output terminal (175). In the graphs (210, 220, 230) of FIG. 4, a DC bias point indicates voltage across all unit cells (110, 120, 130) and total bias current through the SP amplifier (173) (a sum of individual currents flowing through all active unit cells) when an RF signal is equal to zero. Although the graphs shown in FIG. 4 represent voltage and current characteristics for a class A amplifier, the unit cells (110, 120, 130) and by extension the SPTM amplifying arrangement (100) can be configured as other amplifier classes as well (e.g. class B, class AB, and so on). The area of the shaded box can be proportional to RF power, while the area of the solid box can be proportional to DC power. As the RF signal oscillates, an operating point can move along the load line to indicate instantaneous voltage at the SP output terminal (175) and instantaneous total current through the SP amplifier (173).

In the example embodiment of FIG. 4, a first graph (210) represents voltage and current characteristics of the SPTM amplifying arrangement (100) when all unit cells (110, 120, 130) are active while a second graph (220) represents voltage and current characteristics of the SPTM amplifying arrangement (100) when half of all unit cells (110, 120, 130) have been turned OFF. In the second graph (220), the load line has been adjusted for a shallower slope, which can correspond to increased load resistance. Because of the increased load resistance shown in the second graph (220) relative to that shown in the first graph (210), voltage swing (horizontal) at the SP output terminal (175) for a smaller current swing (vertical) can remain as large as voltage swing shown in the first graph (210). The smaller current swing can be caused, for example, by a smaller voltage swing of a signal at the SPTM input terminal (104). A third graph (230) can, for example, represent voltage and current characteristics of the SPTM amplifier when three-fourths of all unit cells (110, 120, 130) have been turned OFF. In the third graph (230), since the load line has been adjusted for an even shallower slope (corresponding to increased load resistance) than in the second graph (220), for a smaller current swing, voltage swing at the SP output terminal (175) can remain as large as in the first and second graphs (210, 220).

Moreover, in the example embodiment of the SP amplifier (173), total bias current can be adjusted by selectively activating or deactivating individual unit cells. Unit cells can be designed such that each unit cell that remains active exhibits a constant bias current. In the example embodiment FIG. 4, a fourth graph (240) shows current and voltage characteristics for an individual unit cell that remains activated (i.e. ON). In such case, both bias current and load resistance (negative reciprocal of slope of load line) can remain constant for the individual unit cell that remains ON. Load resistance seen by the individual unit cell that remains ON can remain constant because, although resistance presented by the TM network (170) increases, such resistance presented by the TM network (170) is distributed across a smaller number of unit cells operating in parallel. A person skilled in the art can be able to comprehend possibility of a load resistance seen by an individual unit cell that remains ON being constant as a result of resistance presented by the TM network (170) increasing but being distributed across fewer unit cells based on standard formulas for an equivalent resistance of multiple resistances connected in parallel.

Additionally, with reference to the first through third graphs (210, 220, 230) shown in the example embodiment of FIG. 4, since the area of the shaded box (proportional to RF power) decreases by a percentage equal to percent decrease of the area of the solid box (proportional to DC power) as periphery of the SPTM amplifying arrangement (100) is reduced in combination with an increase in resistance presented by the TM network (170) at the SP output terminal (175), a ratio of RF power to DC power can remain constant. As is well known, efficiency is generally a function of the ratio of RF power to DC power. Therefore, even at differing power levels, an efficiency of the SPTM amplifying arrangement (100) shown in FIG. 3 can remain constant. Another interpretation is that because voltage and current characteristics for each individual unit cell that remains ON can remain constant, as shown in the fourth graph (240) of FIG. 4, efficiency of each individual unit cell that remains ON can also remain constant. Therefore, efficiency of the overall SPTM amplifier shown in FIG. 3 can remain constant. More detailed information regarding SPTM amplifiers can be found, for example, in U.S. patent application Ser. No. 13/797,779, entitled "Scalable Periphery Tunable Matching Power Amplifier", filed on Mar. 12, 2013, which is incorporated by reference herein in its entirety.

Figure 6A:
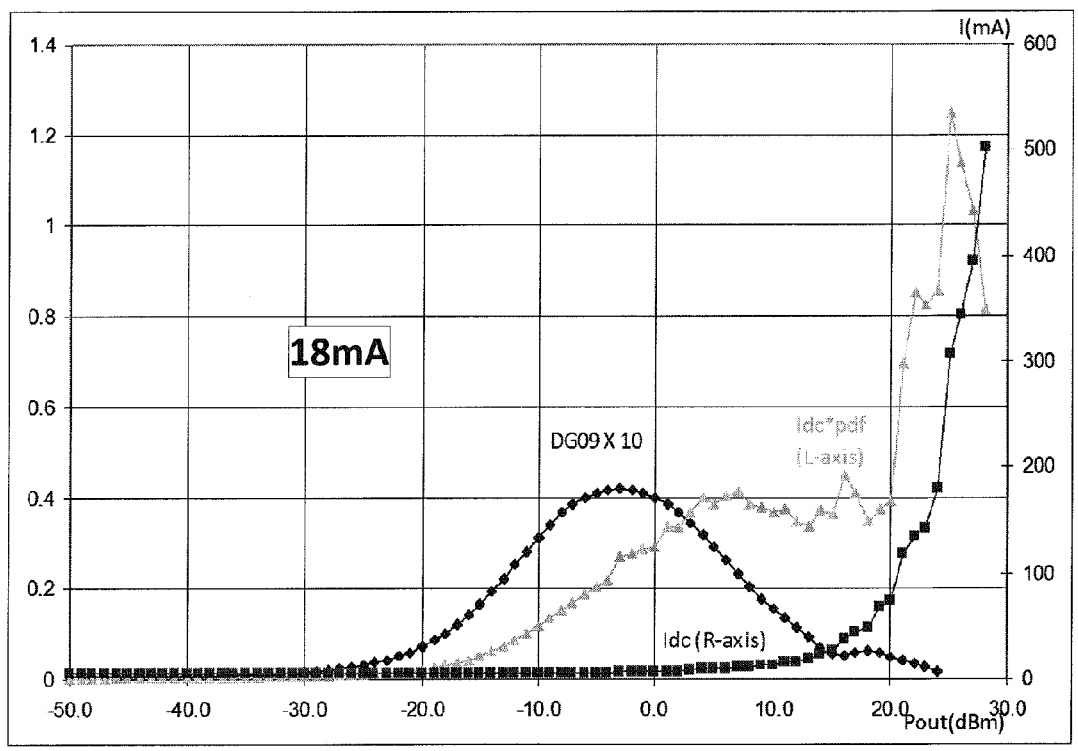
FIGS. 6A and 6B show data corresponding to Wideband Code Division Multiple Access (WCDMA) usage profiles DG09 and HP2 respectively.
Figure 6B:
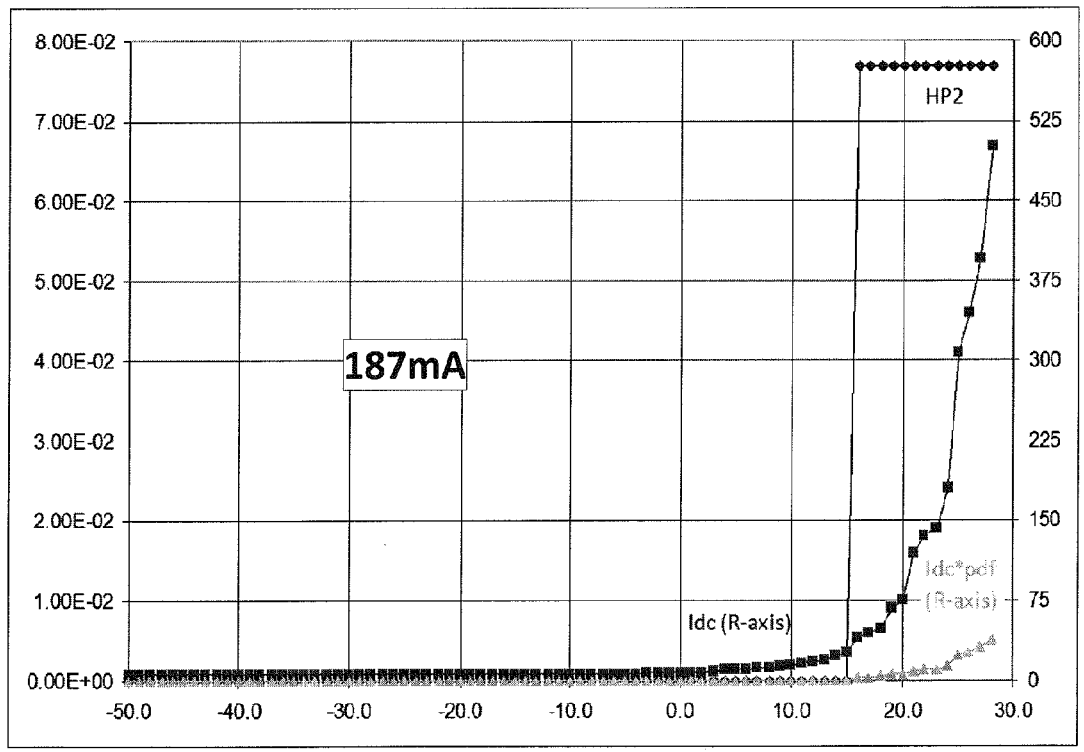

According to an example embodiment of the present disclosure, FIGS. 6A and 6B show data corresponding to WCDMA usage profiles DG09 (FIG. 6A) and HP2 (6B) respectively. The graphs of FIGS. 6A and 6B show PDF (probability density function) of output power, PDF of output current, and output current as a function of output power. The HP2 profile shown in FIG. 6B corresponds to high data transmission, which is associated with higher power output. Moreover, power output can be at or near full power in the HP2 profile, as shown by higher PDF values of the HP2 profile being associated with higher power output values. The DG09 profile shown in FIG. 6A can correspond to lower data transmission (e.g. voice transmission) relative to the HP2 profile of FIG. 6B, as shown by higher PDF values of the DG09 profile being associated with power output values lower than those of the HP2 profile. In the graphs of FIGS. 6A and 6B, "18 mA" and "187 mA" can represent the overall average current when integrated over the DG09 and HP2 user profiles respectively. In general, power amplifier design should be balanced between usage profiles with which the amplifier is intended to be used (such as DG09 and HP2 as shown in FIGS. 6A and 6B). Upon reading the present disclosure, a person skilled in the art will be able to adapt the present teachings to other wireless standards and usage profiles. For example, the SPTM network of FIG. 3 can be used in cell phone applications with linear modulation or digital modulation where linearity over a range of power or frequency can be expected (e.g. WCDMA or wireless LAN 802.11a).

The examples set forth above are provided to give those of ordinary skill in the art a complete disclosure and description of how to make and use the embodiments of the tunable impedance matching network of the present disclosure, and are not intended to limit the scope of what the inventor regard as his disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. An impedance matching network having a first impedance matching terminal and a second impedance matching terminal, the impedance matching network comprising:
   a first parallel reactive network connected to the first impedance matching terminal of the impedance matching network, the first parallel reactive network comprising a plurality of parallel branches each connected the first impedance matching terminal and a reference potential, each parallel branch comprising one or more reactive elements connected in series, wherein one parallel branch from among the plurality of parallel branches comprises two series—connected elements;
   a series reactive network having a first terminal and a second terminal, the series reactive network comprising at least an inductor, the first terminal of the series reactive network being connected to a node joining the two series—connected elements of the one parallel branch of the first parallel reactive network; and
   a second parallel reactive network connected to the second impedance matching terminal of the impedance matching network, the second parallel reactive network comprising a plurality of parallel branches each connected between the second impedance matching terminal and the reference potential, each parallel branch comprising one or more reactive elements connected in series, the second parallel reactive network being connected at a node to both the second impedance matching terminal and to the second terminal of the series reactive network,
   wherein the impedance matching network is configured to match an impedance at the first impedance matching terminal of the impedance matching network to a variable impedance at the second impedance matching terminal of the impedance matching network, and
   wherein the second parallel reactive network is configured to provide a harmonic termination.

2. A circuital arrangement comprising:
   a scalable periphery power amplifier; and
   the impedance matching network of claim 1 connected to the scalable periphery power amplifier.

3. The circuital arrangement of claim 2, wherein the scalable periphery amplifier is adapted, during operation, to amplify a first signal characterized by a first signal power level to produce a second signal that is an amplified version of the first signal, the scalable periphery amplifier comprising:
   one or more unit cells, each unit cell being adapted to be selectively activated or deactivated, wherein each such unit cell comprises one or more active devices configured to operate as an amplifier; and
   an amplifier control circuitry that is configured to selectively activate or deactivate the one or more unit cells in response to changing input signal power level to tune total current output from the scalable periphery amplifier,
   wherein an output of the scalable periphery amplifier is connected to the second impedance matching terminal of the impedance matching network.

4. The circuital arrangement according to claim 3, wherein the impedance matching network is configured to match a variable impedance of the output of the scalable periphery amplifier connected to the second impedance matching terminal to a fixed impedance at the first impedance matching terminal.

5. The circuital arrangement of claim 4, wherein the amplifier control circuitry is further configured to tune the impedance matching network for a desired transfer of an output power at the output of the scalable periphery amplifier to the first impedance matching terminal of the impedance matching network.

6. The circuital arrangement according to claim 4, wherein during operation of the circuital arrangement, a varying value of the variable impedance is higher and lower than a fixed value of the fixed impedance.

7. The circuital arrangement of claim 3, wherein tunable capacitors of the impedance matching network are monolithically integrated on a chip with the one or more unit amplifier of the scalable periphery amplifier using silicon on insulator or silicon on sapphire technology.

8. The circuital arrangement of claim 3, wherein the circuital arrangement is monolithically integrated.

9. The impedance matching network of claim 1, wherein:
   a first parallel branch from among the plurality of parallel branches of the first parallel reactive network comprises a first tunable capacitor;
   a second parallel branch from among the plurality of parallel branches of the first parallel reactive network comprises an inductor;
   the two series-connected elements of the one parallel branch are a series-connected first capacitor and second tunable capacitor, respectively;
   a first parallel branch from among the plurality of parallel branches of the second parallel reactive network comprises an inductor;
   a second parallel branch from among the plurality of parallel branches of the second parallel reactive network comprises a third tunable capacitor; and
   a second capacitor serially-connected with both the first parallel branch and the second parallel branch of the second parallel reactive network.

10. The impedance matching network of claim 9, wherein the series reactive network is devoid of tunable capacitors.

11. The impedance matching network of claim 10, being configured to match the variable impedance at the second impedance matching terminal to a fixed impedance at the first impedance matching terminal.

12. The impedance matching network of claim 10, wherein the impedance matching network is devoid of tunable inductors.

13. The impedance matching network of claim 9, wherein one or more of: a) the first tunable capacitor, b) the second tunable capacitor, and c) the third tunable capacitor, is a digitally tunable capacitor (DTC).

14. The impedance matching network of claim 1, wherein:
   a first parallel branch from among the plurality of parallel branches of the second parallel reactive network comprises an inductor;
   a second parallel branch from among the plurality of parallel branches of the second parallel reactive network comprises a third tunable capacitor; and
   a second capacitor serially-connected with both the first parallel branch and the second parallel branch of the second parallel reactive network.

15. The impedance matching network of claim 14, wherein the series-connected second capacitor is a tunable capacitor.

16. The impedance matching network of claim 1, being configured to match the variable impedance at the second impedance matching terminal to a fixed impedance at the first impedance matching terminal over a frequency range of operation.

17. The impedance matching network of claim 16, wherein the fixed impedance is 50Ω.

18. The impedance matching network of claim 1, wherein:
   a first parallel branch from among the plurality of parallel branches of the first parallel reactive network comprises a first tunable capacitor;
   a second parallel branch from among the plurality of parallel branches of the first parallel reactive network comprises an inductor; and
   the two series-connected elements of the one parallel branch are a series-connected first capacitor and second tunable capacitor, respectively.

19. The impedance matching network of claim 1, the impedance matching network is devoid of tunable inductors.

20. The impedance matching network of claim 1, wherein:
   a first parallel branch from among the plurality of parallel branches of the first parallel reactive network comprises a first tunable capacitor;
   a second parallel branch from among the plurality of parallel branches of the first parallel reactive network comprises an inductor; and
   the two series-connected elements of the one parallel branch are a series-connected first capacitor and second tunable capacitor, respectively.

21. The impedance matching network of claim 1, wherein the first parallel reactive network comprises two tunable capacitors, the second parallel reactive network comprises one tunable capacitor and the series reactive network is devoid of tunable capacitors.

22. A method for adjusting operation of an amplifier, the method comprising:
   connecting an output of an amplifier to an impedance matching circuit according to claim 1; tuning the impedance matching circuit according to a parameter affecting operation of the amplifier.

23. The method of claim 22, wherein the parameter affecting operation of the amplifier comprises one or more of: a) a frequency of operation in correspondence of an input signal to the amplifier, b) a modulation scheme in correspondence of the input signal to the amplifier, c) an input power in correspondence of the input signal to the amplifier, and d) a manufacturing tolerance in correspondence of a component of the amplifier.

24. The method of claim 23, wherein the amplifier is a scalable periphery amplifier.

25. The method of claim 24, further comprising:
   adjusting one or more of: a) a periphery size, b) a supply, and c) a bias voltage in correspondence of a unit cell, of the scalable periphery amplifier.

26. An impedance matching network having a first impedance matching terminal and a second impedance matching terminal, the impedance matching network comprising:
   a first parallel reactive network connected to the first impedance matching terminal of the impedance matching network, the first parallel reactive network comprising a plurality of parallel branches each connected the first impedance matching terminal and a reference potential, each parallel branch comprising one or more reactive elements connected in series, wherein one parallel branch from among the plurality of parallel branches comprises two series—connected elements;
   a series reactive network having a first terminal and a second terminal, the series reactive network comprising at least an inductor, the first terminal of the series reactive network being connected to a node joining the two series—connected elements of the one parallel branch of the first parallel reactive network; and
   a second parallel reactive network connected to the second impedance matching terminal of the impedance matching network, the second parallel reactive network comprising a plurality of parallel branches each connected between the second impedance matching terminal and the reference potential, each parallel branch comprising one or more reactive elements connected in series, the second parallel reactive network being connected at a node to both the second impedance matching terminal and to the second terminal of the series reactive network,
   wherein the impedance matching network is configured to match an impedance at the first impedance matching terminal of the impedance matching network to a variable impedance at the second impedance matching terminal of the impedance matching network, and
   wherein:
      a first parallel branch from among the plurality of parallel branches of the first parallel reactive network comprises a first tunable capacitor;
      a second parallel branch from among the plurality of parallel branches of the first parallel reactive network comprises an inductor;
      the two series-connected elements of the one parallel branch are a series-connected first capacitor and second tunable capacitor, respectively;
      a first parallel branch from among the plurality of parallel branches of the second parallel reactive network comprises an inductor;
      a second parallel branch from among the plurality of parallel branches of the second parallel reactive network comprises a third tunable capacitor; and
      a second capacitor serially-connected with both the first parallel branch and the second parallel branch of the second parallel reactive network.

27. The impedance matching network of claim 26, wherein the series reactive network is devoid of tunable capacitors.

28. The impedance matching network of claim 27, being configured to match the variable impedance at the second impedance matching terminal to a fixed impedance at the first impedance matching terminal.

29. The impedance matching network of claim 27, wherein the impedance matching network is devoid of tunable inductors.

30. The impedance matching network of claim 26, wherein one or more of: a) the first tunable capacitor, b) the second tunable capacitor, and c) the third tunable capacitor, is a digitally tunable capacitor (DTC).

* * * * *